US005485473A

United States Patent [19]
Diebold et al.

[11] Patent Number: 5,485,473
[45] Date of Patent: Jan. 16, 1996

[54] METHOD AND SYSTEM FOR TESTING AN INTEGRATED CIRCUIT FEATURING SCAN DESIGN

[76] Inventors: Ulich Diebold, Gaensbergring 74, 7033 Herrenberg; Peter Rost, In den Lunkteilen 4, 7260 Calw; Manfred Schmidt, Dachenhaeuserweg 37, 71101 Schoenaich; tto Torreiter, Fleinsbachstrasse 14, 7022 Leinfelden-Echterdingen; Rolf Vogt, Herrschaftsgartenstrasse 73, 7030 Boeblingen; Klaus Wagner-Drebenstedt, Eugenstrasse 19, 7403 Ammerbuch 1, all of Germany

[21] Appl. No.: 109,794

[22] Filed: Aug. 20, 1993

[30] Foreign Application Priority Data

Aug. 25, 1992 [EP] European Pat. Off. ............... 92114431

[51] Int. Cl.$^6$ ................................................. G01R 31/28
[52] U.S. Cl. ................................................. 371/22.1; 371/27
[58] Field of Search ........................... 371/27, 22.1, 22.5, 371/22.3; 364/488, 489, 580

[56] References Cited

U.S. PATENT DOCUMENTS 4,441,075  4/1984  McMahon ............................. 324/73 R
4,716,564  12/1987  Hung et al. ............................. 371/27
4,745,603  5/1988  Shedd .................................... 371/27
4,853,928  8/1989  Williams ................................ 371/27
4,996,659  2/1991  Yamaguchi et al. ................. 364/579
5,321,701  6/1994  Raymond et al. .................... 371/27
5,331,570  7/1994  Bershteyn ............................ 364/580

FOREIGN PATENT DOCUMENTS 0216077  4/1987  European Pat. Off. ........ G01R 31/26

OTHER PUBLICATIONS

13th Annual Symposium on Fault–Tolerant Computing, Jun. 28–30, 1983 pp. 222–226 IEEE, New York, US; D. T. Tang et al, "Logic Test Pattern Generating Using Linear Codes".
Proceedings of the Intl. Test Conf., Sep. 10–14, 1990, pp. 670–679, IEEE, New York, US, S. Hellebrand, "Generating Pseudo–Exhaustive Vectors for External Testing".
Design for Contactless Testability in a Scan–Path Environment–Josef GroB, Torsten Gruning–1991–16 pages.

*Primary Examiner*—Ellis B. Ramirez

[57] ABSTRACT

The present invention provides for improved testing of an integrated circuit. In order to measure a test signal S from the integrated circuit 1 a multi-pattern is placed in a shift register. The multi-pattern is generated by overlaying at least two test patterns Ax and Bx. Therefore the signal S changes its state in response to only a small amount of shift operations.

11 Claims, 3 Drawing Sheets

MULTI-PATTERN DEVELOPMENT

| STEP NO | TEST PAT. | DIS-CYCLE | BIT POSITION |
|---|---|---|---|
| | | | 1  2  3  4  5  6  7  8  9  10 11 12 13 14 15 16 17 18 19 20 21 |
| 1 | A3 | 0 | X  1  X  X  1  X  1  X  X  1  X  .  .  .  .  .  .  .  .  .  . |
| 2 | B1 | 1 | .  X  0  X  X  1  X  X  X  X  X  .  .  .  .  .  .  .  .  .  . |
| 3 | A3 | 2 | .  .  X  1  X  X  1  X  1  X  X  1  X  .  .  .  .  .  .  .  . |
| 4 | B2 | 3 | .  .  .  X  1  X  X  0  X  X  X  X  X  .  .  .  .  .  .  .  . |
| 5 | A2 | 4 | .  .  .  .  X  1  X  X  1  X  0  X  X  X  X  .  .  .  .  .  . |
| 6 | B3 | 6 | .  .  .  .  .  .  X  0  X  X  0  X  X  X  X  X  X  .  .  .  . |
| 7 | A3 | 7 | .  .  .  .  .  .  .  X  1  X  X  1  X  1  X  X  1  X  .  .  . |
| 8 | B2 | 8 | .  .  .  .  .  .  .  .  X  1  X  X  0  X  X  X  X  X  .  .  . |
| 9 | A3 | 10 | .  .  .  .  .  .  .  .  .  .  X  1  X  X  1  X  1  X  X  1  X |
| 10 | B1 | 11 | X  .  .  .  .  .  .  .  .  .  .  X  0  X  X  1  X  X  X  X  X |
| 11 | A3 | 12 | 1  X  .  .  .  .  .  .  .  .  .  .  X  1  X  X  1  X  1  X  X |
| 12 | B2 | 13 | X  X  X  .  .  .  .  .  .  .  .  .  .  X  1  X  X  0  X  X  X |
| 13 | A1 | 15 | 1  X  X  0  X  .  .  .  .  .  .  .  .  .  .  X  1  X  X  1  X |
| 14 | B1 | 16 | X  X  X  X  X  X  .  .  .  .  .  .  .  .  .  .  X  0  X  X  1 |
| 15 | A3 | 18 | X  1  X  1  X  X  1  X  .  .  .  .  .  .  .  .  .  .  X  1  X |
| 16 | B2 | 19 | X  X  0  X  X  X  X  X  X  .  .  .  .  .  .  .  .  .  .  X  1 |
| | | | |
| 1 | A3 | 0 | X  1  X  X  1  X  1  X  X  1  X  .  .  .  .  .  .  .  .  .  . |
| 2 | B1 | .. | .  .  .  .  .  .  .  .  .  .  .  .  .  .  .  .  .  .  .  .  . |
| 3 | .. | .. | .  .  .  .  .  .  .  .  .  .  .  .  .  .  .  .  .  .  .  .  . |
| RESULTING MULTI-PATTERN | | | 1  1  0  1  1  1  1  0  1  1  0  1  0  1  1  1  1  0  1  1  1 |

METHOD AND SYSTEM FOR TESTING AN INTEGRATED CIRCUIT FEATURING SCAN DESIGN

BACKGROUND OF THE INVENTION

A) Technical Field

The present invention relates to methods of generating a multi-pattern signal for testing of an integrated circuit featuring scan design, and to measurement of a signal in such an integrated circuit as well as to a test system for testing of such an integrated circuit.

B) Background Art

One of the best known test methods for testing large scale integrated circuits is level sensitive scan design (LSSD), which is generally described in the article "A Logic Design Structure for LSI Testability", Proceedings of the Design Automation Conference, No. 14, 20–22, Jun. 1977, New Orleans, La., by E. B. Eichelberger. See also U.S. Pat. No. 4,590,078 and U.S. Pat. No. 4,428,060. See an article by E. J. McCluskey, "A Survey of Design for Testability Scan Techniques", VLSI Design, December 1984, pp. 38–61, for a comprehensive list of patents and publications for the testing of electronic structures.

Basically, LSSD utilizes a plurality of controllability/observability points internal to an LSI circuit. Controllability is provided by allowing data to be shifted into these points which are comprised of shift register latches (SRL's) in a serial manner. A test is then performed. The resulting data stored in the SRL's is subsequently shifted back out for observation thereof. Therefore, control/observation of an LSI circuit does not depend on the number of pins in the package. Furthermore, because the latches themselves are part of the internal circuit, they can be utilized to break feed-back paths in a sequential circuit, enabling the test for combinational circuits between SRL's to be generated automatically.

In a typical scan design, the shift registers are located at specific points required for the design function but are connected together in the scan chain for testing purposes. The scan chain allows for realization of any test states in the registers for test application. A test pattern is then generated on a computer. The generated test pattern is then shifted into the SRL's; test vectors (selected words or groups of digital data) are applied to the primary inputs or pins of the chip; the system clocks are applied to perform the test, and the signals at the primary output pins are compared to expected vector outputs and data scanned out of the SRL's to compare it to known good test vectors. In performing this test, numerous series of test vectors are usually required for shifting data into the SRL's, applying the test vectors, and then shifting the results back out. In order to fully realize the potential of LSSD testing, test generation software must be able to generate the required test patterns for loading into the SRL's inside the chip.

Another class of scan designs is the boundary scan architecture as defined e.g. in IEEE Std 1149.1. An overview of diverse boundary-scan designs as well as a list of further references is given in "The Test Access Port and Boundary-Scan Architecture", by C. M. Maunder and R. E. Tulloss, IEEE Computer Society Press, Los Alamitos, Calif., 1990.

A common disadvantage of the above described scan-path architectures is that for each test a separate test pattern is shifted into the scan-path. After a functional step is performed the resulting data is shifted out for observation thereof. One example of generating a test pattern is described in U.S. patent application Ser. No. 07/744,760 filed on Aug. 14, 1991 (abandoned). If the scan-path comprises a large number of SRL's and if a large number of test patterns is to be shifted into the scan-path, testing consequently takes a relatively long period of time.

SUMMARY OF THE INVENTION

It is thus an object of the invention to a provide method and apparatus for improved testing of an integrated circuit featuring scan design.

Another object of the present invention is to reduce the number of test patterns to be shifted in separately. The foregoing and other objects of the present invention are realized by overlaying two or more test patterns to form a multi-pattern. The invention takes advantage of the fact that in practice, in most test patterns, a high percentage of the bit positions are "don't cares". Therefore it is possible to overlay a plurality of test patterns without interference, if the test patterns are shifted for an appropriate distance with respect to each other prior to overlaying the displaced test patterns.

According to a preferred embodiment of the invention the resulting multi-pattern is shifted into a scan-path of the integrated circuit under test. If a specific signal is to be tested, the state of that signal depends only on those SRL's which are comprised in the corresponding cone. Thus the multi-pattern is shifted into the scan-path so that shift-in data is stored in the SRL's of that cone. Subsequently the response of the particular signal thereto is measured and the multi-pattern is shifted in the scan-path for a certain shift-amount. The displacement of subsequent overlaid test patterns relative to each other determines that shift-amount. After the multi-pattern is shifted by this distance the signal is measured again. If subsequent test patterns which are overlaid to form the multi-pattern correspond to different responses of the signal which is measured, this signal changes its state, when the multi-pattern is shifted in the scan-path. Thus a relatively small amount of shift operations is necessary to shift the multi-pattern in the scan-path so that the signal which is measured changes its state. Thereby the test procedure is greatly enhanced and sped up because changing the state of the signal no longer implies a complete shift-in operation of a test pattern.

In further preferred embodiments of the invention the distance by which the test patterns are displaced relatively to each other is minimized, so that testing is further sped up. This minimization is performed by combining possible patterns and thereby establishing a ranking of test patterns according to the shift distances necessary.

However, minimal shift distances do not always have highest priority. In some cases it is also important to attain a certain statistical distribution of test patterns in the multi-pattern. This may require that not in all cases the test pattern having a minimal shift distance is chosen.

The invention further provides for a system for testing an integrated circuit featuring scan design. In the inventive test system the multi-pattern is shifted into a scan-path of an integrated circuit under test, and the response of a signal thereto is measured by measurement means such as contactless measurement means e.g. E-beam or laser measurement. The result of the measurement is compared to the expected signal. In order to increase the signal-to-noise ratio, the measurement is advantageously performed repeatedly by shifting the multi-pattern several times through the scan-path. If subsequent responses of the signal which is measured are added, the signal-to-noise ratio is thereby increased.

This adding of the measured signal is performed by statistically analyzing the measured signal. This statistical analysis preferably is performed separately for each different test pattern of the multi-pattern. This is accomplished by providing the test pattern identification of that test pattern which is shifted into the relevant cone to the means for statistically analyzing. Thereby each measurement is assigned to a specific test pattern so that the statistical analysis is performed separately. As a result the means for statistically analyzing produce a separate curve for each test pattern whereby the curve represents the response of the measured signal to a specific test pattern.

BRIEF DESCRIPTION OF THE DRAWING

In the following preferred embodiments of the invention shall be described in more detail below, with reference to the enclosed Drawing, in which

FIG. 2.1 shows the displacement of test patterns and subsequent overlay to generate the multi-pattern test signal;

FIG. 2.2 shows the shift in of the multi-pattern into a scan-path; and

DETAILED DESCRIPTION OF THE PREFERRED EMBODIMENTS

Figure 1:
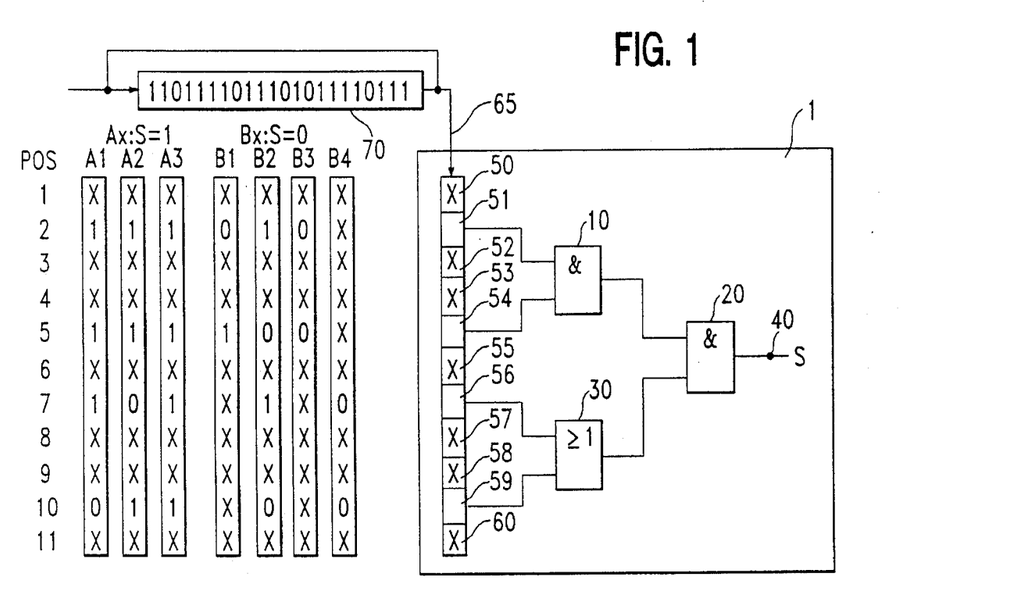
FIG. 1 is a schematic diagram illustrating the principle of the generation of the multi-pattern test signal.

With reference to FIG. 1 the principle of the generation of the inventive multi-pattern is explained in detail. In FIG. 1 the integrated circuit under test is depicted schematically as a single chip 1. The circuit schematic shown in FIG. 1 of chip 1 is greatly simplified since only a small portion of a scan-in-path 65 comprising SRL's 50 to 60 is depicted. Further only one single "cone" (i.e. combination of scan-in SRL's and processing logic) together with its output signal S is shown in FIG. 1. The cone runs from SRL 51 to SRL 59 in the scan-path 65 and comprises the AND-gates 10 and 20 as well as OR-gate 30. The inputs of the AND-gate 10 are interconnected with the outputs of the SRL's 51 and 54 only whereas the inputs of the OR-gate 30 are interconnected with the outputs of SRL's 56 and 59 only. The inputs of the AND-gate 20 are interconnected with the outputs of AND-gate 10 and OR-gate 30. The output of AND-gate 20 provides the signal S at measuring point 40. Thus the state of the signal S is only dependent on the outputs of SRL's 51, 54, 56 and 59. The data stored in SRL's 52, 53, 55, 57 and 58 does not influence the output of AND-gate 20 since the outputs of these SRL's are not interconnected to any of the inputs of the logic gates 10, 20 or 30, even though these SRL's are comprised in the cone. The SRL's 50 and 60, which are outside the first and last SRL's having inputs to the cone, do not influence the output signal S by definition. All of the SRL's, both inside and outside the cone, which do not influence the output signal S have "don't care" data stored therein which is denoted by an "X" in FIG. 1.

Further, a table of test patterns Ax and Bx is shown in FIG. 1. The three different test patterns A1, A2 and A3 cause the signal S to be at logically one, if they are shifted into the scan-in-path 65 and if the appropriate clock and control signals are applied subsequently as it is well known in the art. Analogously the test patterns B1, B2, B3 and B4 cause the output signal S to be at logically zero when applied to scan chain 65. The test patterns Ax and Bx have bit positions Pos 1 to 11 corresponding to SRL's 50 to 60. Generally the multi-pattern input of the invention is generated by displacing n bit positions the test patterns Ax and Bx relative to each other and applying the result as a single input to the SRL chain. One possible multi-pattern is stored in the shift register 70. The shift register 70 performs ring-shift operations in order to shift the desired test patterns into the scan-path 65. This will be described in more detail below with reference to FIGS. 2.1 and 2.2.

In FIG. 2.1 an example of the development of the inventive multi-pattern is illustrated by way of example. In this example the test pattern A3 as shown in FIG. 1 is chosen to be the first pattern scanned into the scan-in-path 65. It is thus placed at bit positions 1 to 11 in the table shown in FIG. 2.1. Because the test pattern A3 is not displaced with respect to bit position 1, "DISPLACE" is zero. In step no. 2, the test pattern B1 is chosen. The test pattern B1 is displaced with respect to the first bit position and thus with respect to test pattern A3 by only one bit position. Test pattern B1 is thus placed on bit positions 2 to 12. Due to the displacement of test pattern B1 relatively to test pattern A3 it is possible to overlay those two test patterns on one another because of the "don't care" bit positions "X" occurring in both test patterns. Note from FIG. 2.1 that the data in B1 as shifted is at the same bit positions as Xs in A3, and vice-versa. Analogously in the following steps 3 to 9 the test patterns A3, B2, A2, B3, A3, B2 and A3 are chosen, displaced, and overlaid on one another as described above. In steps 6 and 9 it necessary to increment the amount of displacement by two in order to find a matching position of the patterns to be overlaid. From step 10 on where the test pattern B1 is chosen the test patterns overflow at bit position 21. That is, note that at step 10 the patterns have been displaced by 11 bit positions, which is the number of bit positions supported by the SRL. Test pattern B1 is placed at bit position 12 to 21 whereas the last bit of test pattern B1 is placed at the first bit position 1. Due to this overflow at bit position 21 the resulting multi-pattern is also restricted to 21 bit positions. In the following steps 11 to 16 further test patterns A3, B2, A1, B1, A3 and B2 are chosen analogously and displaced with respect to the first bit position 1. The test patterns Ax and Bx are chosen and displaced so that in each column of the table shown in FIG. 2.1 corresponding to one of the bit positions 1 to 21 only matching data are comprised. If there are not only "don't care" bits "X" comprised in a column, each column is restricted to comprise either a number of additional "1" bits or a number of additional "0" bits. This condition is fulfilled for each of the columns 1 to 21 corresponding to bit positions 1 to 21 as shown in FIG. 2.1. Thus it is possible to overlay the 16 test patterns which are chosen in steps 1 to 16. The resulting multi-pattern comprises 21 bit positions due to the overflow from step 10 onwards. The value of the first bit position 1 of the resulting multi-pattern is determined by the column belonging to bit position 1. This column comprises the following bits: XX1X1XXX. Since in the first column only "don't care" bits "X" and "1" bits are comprised the result of overlaying those bits is a "1" bit. The same rule applies for bit position 2 of the resulting multi-pattern. The column of bit position 3 is the following: X0XXXXX0. Since only "don't care" bits "X" and "0" bits are comprised in that column, the resulting bit of the overlay of the test patterns is a "0" bit in this case. Applying these rules for all of the bit positions 1 to 21 yields the resulting multi-pattern 110111101101011110111. In the example shown in FIG. 2.1 no column occurs containing exclusively "don't care" bits "X". If this should be the case, the resulting bit of the overlay operation could be chosen arbitrarily.

In FIG. 2.2 it is illustrated by way of example how the resulting multi-pattern is induced into the integrated circuit chip 1 under test. First the multi-pattern is placed in the shift register 70. During this initialization phase there is no test pattern induced into the scan-in-path 65 shown in FIG. 1. To initialize the testing the multi-pattern is shifted into the scan-in-path 65 so that a first 11-bit portion of the multi-pattern corresponding to the test pattern A3 which is chosen in step 1 of FIG. 2.1 is scanned into the scan-in-path 65. This requires eleven shift cycles since there are eleven SRL's and thus eleven bit positions comprised in that scan-in-path. The response to the signal S to the input of test pattern A3 is measured in order to compare the measured signal S to the expected signal. If the measured signal S and the expected signal S differ, this indicates that the integrated circuit chip 1 under test is defective. Then the multi-pattern is shifted for one shift cycle in order to induce the test pattern B1 into the scan-in-path 65. Only one shift cycle is necessary since the test pattern B1 is displaced with respect to test pattern A3 for only one bit position. After this additional shift operation the response of the signal S is measured again comparing the result of the shifted multi-pattern to the expected signal S. Subsequently the following test patterns A3, B2, A2, B3, A3, B2, A3, B1, A3, B2, A1, B1, A3, B2 and A3 are shifted-in analogously and the response of the signal S thereto is measured for each induced test pattern. The amount of shift cycles necessary to shift-in a test pattern corresponds to the relative displacement of subsequent test patterns. After the initialization which takes 11 shift cycles in order to induce the test pattern A3 in step 1, only one or two shift cycles are necessary in this example in order to shift-in subsequent test patterns in the following steps. The number of shift cycles necessary from step 2 onwards directly corresponds to the relative displacement of subsequent test patterns from step 2 onwards as shown in FIG. 2.1. The relative displacement of test pattern B1 in step no. 2 of FIG. 2.1 with respect to the proceeding test pattern A3 of step no. 1 is one bit position, so that the corresponding number of shift cycles necessary in step 2 of FIG. 2.2 in order to induce the test pattern B1 is also 1. In step 6 of FIG. 2.2 however two shift cycles are necessary to induce the test pattern B3. This is due to the fact that the test pattern B3 is chosen in step 6 of FIG. 2.1 and is displaced with respect to the proceeding test pattern A2 of step no. 5 by two bit positions. In step no. 16 of FIG. 2.2 the last test pattern B2 is induced into the scan-in-path 65 of the integrated circuit chip 1 under test. This corresponds to the choice of test pattern B2 in step no. 16 of FIG. 2.1.

In some cases it is desirable to repeat the entire test sequence of steps 1 to 16. In order to repeat this test sequence the multi-pattern is shifted for only two shift cycles in step 17 so that again test pattern A3 is induced into the scan-in-path 65 and the multi-pattern in the shift register 70 again is at the same position as it is in step no. 1 of FIG. 2.2. Thus step 17 represents the same condition as step 1. Accordingly a further shift cycle would cause the test pattern B1 to be induced into the scan-in-path 65 corresponding to step no. 2 so that with subsequent shift cycles the entire test sequence of steps 1 to 16 is repeated. Thus it is possible according to the invention to induce a relatively large amount of test patterns—in this case 16—with a small amount of shift cycles—in this case by 21 shift cycles. Testing is thereby greatly sped up as compared to the prior art since according to prior art testing methods each test pattern is shifted-in separately requiring a full amount of 11 shift cycles corresponding to the number of bits to be shifted-in.

The invention is particularly advantageous if a high frequency of the signal which is to be measured is required by the measurement system as it is the case if an E-beam tester is employed. The particular problems associated with E-beam testing in a scan-path environment are discussed in "Design for Contactless Testability in a Scan-Path Environment", by J. Gross and T. Gruening, Contribution for ETC 1991. The result of their analysis is that measurements of the signal S with both high time and voltage resolutions are practically impossible for known scan-path designs. E-beam testing generally requires a periodic repetition of the signal S which has to be measured. It is necessary according to the prior art to separately shift-in patterns Ax and Bx into the scan-path in order to make the signal S repeatedly changing its state from "1" to "0" or vice versa. It is to be noted that a scan-in-path 65 may comprise up to several thousand SRL's so that each signal transition of the signal S requires accordingly several thousand shift cycles. This results in very long times needed for testing of the circuit and makes E-beam testing thus practically not applicable to testing of scan-path designs.

The invention solves that problem because the test patterns Ax and Bx are overlaid so that a very small amount of shift cycles such as 1 or 2 is necessary in order to shift-in different test patterns and to make the signal S change its state. Because standard test patterns comprise up to about 97% of "don't care" bits "X", choosing appropriate test pattern and offsets according to the above described rules is performed easily.

The invention is also particularly valuable if other measurement systems are employed such as laser testers or the like. A full chip integrated circuit tester for dynamic measurements is known from EP-B-0 216 077. The invention is particularly beneficial in such an environment, since the inventive multi-pattern provides for rapid signal changes and thus short testing times.

In some cases it is desirable to choose subsequent test patterns so that the resulting displacement "DISPLACE" is minimal since this results in a minimized test time. This is advantageously accomplished by determining the displacement distances for a plurality of possible test patterns and to establish a ranking of those test patterns based on this determination. The highest ranking test pattern or with other words the test pattern with the smallest displacement distance is thus chosen.

In other cases a minimal test time is not the most important test criterion but a certain statistical distribution of test pattern in the resulting multi-pattern. This requires that each test pattern is chosen in the multi-pattern development shown in FIG. 2.1 for substantially a predetermined number of times. One possibility to statistically distribute a choice of test patterns is to equally distribute this choice so that each test pattern occurs substantially for the same number of times in the above described overlay process of FIG. 2.1.

If an E-beam tester is employed for measurement of the signal S, it is particularly advantageous to ring-shift the multi-pattern several times so that the above described test sequence of FIG. 2.2 is carried out repeatedly. Thereby it is possible to analyze the measured signal S statistically and thus improve the quality of this measurement. The signal to noise ratio of the measured signal is substantially enhanced and the voltage resolution is increased if e.g. results of subsequent measurements are added. A result of one of those measurements is only added to prior measurements in order to improve the signal to noise ratio, if it corresponds to its expected value. If this is not the case, this shows that the integrated circuit chip 1 under test is defective. If each possible test pattern Ax, Bx is chosen at least once for the multi-pattern, the test coverage is 100%. This is not always necessary; in FIG. 2.1 note the test pattern B4 was not chosen for the multi-pattern of that Figure.

It is also possible to statistically analyze subsequent measurements of the signal S separately for each of the test patterns.

One way of performing this statistical analysis is to calculate a separate signal $S_{Ax, Bx}$ for each of the test patterns. The signal $S_{Ax, Bx}$ is obtained as follows $$S_{Ax,Bx} = \frac{1}{N} \sum_{i=1}^{N} S_i(Bx \to Ax)$$

where $S_i$ (Bx→Ax) is the signal S which is measured in response to a transition from test pattern Bx to test pattern Ax. Signals $S_{Ax, Bx}$ obtained according to the above equation facilitate the diagnosis of the integrated circuit chip 1 under test. Since the results of the N measurements of the signal S due to a transition of test pattern Bx to test pattern Ax are added, the signal to noise ratio of the resulting signal $S_{Ax, Bx}$ is enhanced.

It is to be understood that the above described methods of generating a multi-pattern may be carried out by a known computer system.

The improved circuit diagnosis due to the above described separate statistical analysis will now be described by way of example. If e.g. the OR-gate 30 of FIG. 1 is defective so that it outputs a logical "1" irrespective of its input, this so-called "stuck at fault" is detected by the above described separate analysis. A transition from one of the test patterns Ax to test pattern B4 in this case would not change the state of the signal S from logically "1" to logically "0". If the signal $S_{B4, Ax}$ is obtained according to the following equation $$S_{B4,Ax} = \frac{1}{N} \sum_{i=1}^{N} S_i(Ax \to B4)$$

the defective OR-gate 30 is thereby identified.

Figure 3:
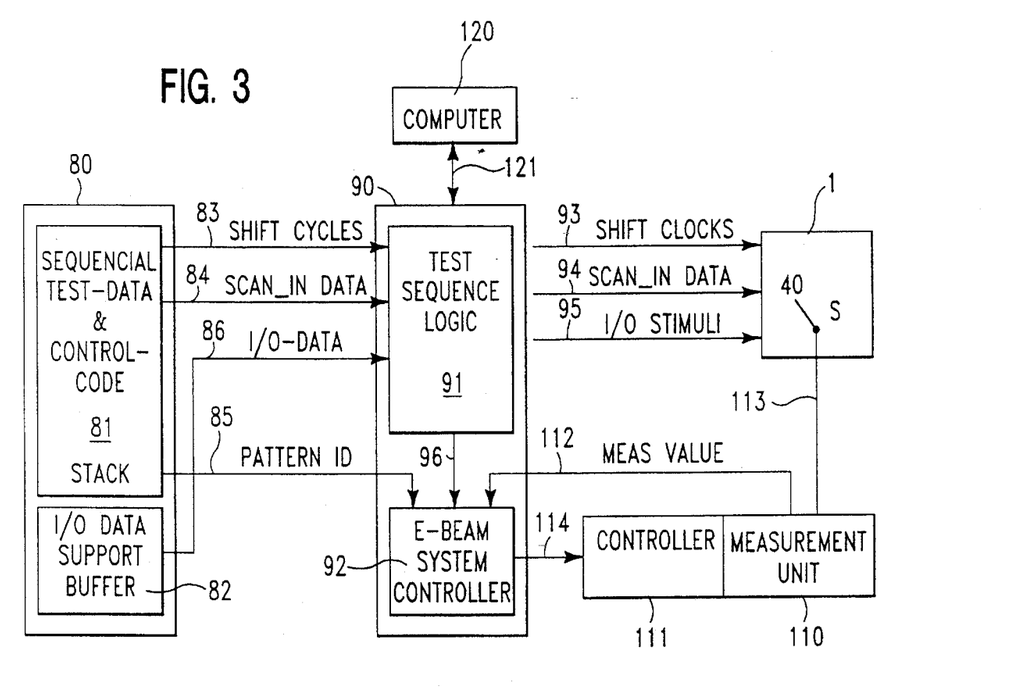
FIG. 3 is a block diagram showing a preferred configuration of a test system using the inventive multi-pattern.

In the following a preferred embodiment of the hardware of the inventive test system is described with reference to FIG. 3. The inventive test system comprises test data storage means 80, test control logic means 90, a measurement unit 110 and a controller 111. The test data storage means comprise a stack for sequential storage of test-data and control code data. The test-data comprise the multi-pattern which is generated according to the method as described with reference to FIGS. 1 and 2 whereas the control code comprises the shift cycles necessary according to FIG. 2.2. Via lines 83 and 84 the number of the required shift cycles and the scan-in data which is to be shifted into the scan-in-path 65 of the chip 1 are transmitted in parallel to the test sequence logic 91 comprised in the test control logic means 90. The test sequence logic 91 provides the shift clocks and the scan-in data to the chip 1 via lines 93 and 94. At measurement point 40 the signal S is measured via line 113 by the measurement unit 110 which in this case is an E-beam tester. The measurement value is transmitted via line 112 to the E-beam system controller 92 which is also comprised in the test control logic means 90. Further an identification number of the test pattern which is shifted-in the scan-in-path 65 is provided via line 85 to the E-beam system controller 92. Further the E-beam system controller 92 is coupled via line 96 to the test sequence logic 91. The E-beam system controller transmits control signals to the controller 111 via line 114. Thus the E-beam system controller 92 synchronizes the system and provides trigger pulses via line 114 to the controller 111. The i-o stimuli which are necessary to put the chip 1 into the test node are applied via line 95 from the test sequence logic 91 to the chip 1. These i-o stimuli are derived from the i-o-data transmitted via line 86 to the test sequence logic 91 from the i-o-data support buffer 82 which is comprised in the test data storage means 80.

It is to be understood that while the invention has been shown and described with reference to particular embodiments, various modifications may be made to such embodiments without departing from the spirit and scope of the invention. For example, even though the measurement unit 110 in this case is an E-beam tester, other types of measurement apparatuses are also applicable in the inventive test system. Further, it is to be noted that the above described statistical analysis may be performed by any suitable computer system 120, if the measurement values are provided to the computer 120 via line 121.

We claim:

1. A method of testing circuitry including at least one shift register, comprising the steps of:
   (a) inputting an X+A-bit test signal pattern into the shift register;
   (b) forming an input test signal pattern of X bits by recirculating said X+A-bit test signal pattern;
   (c) shifting said X-bit input test signal pattern from the shift register to the circuitry under test and carrying out a first test;
   (d) shifting said X+A-bit test signal pattern in the shift register by Y bits ($1 \leq Y < X$) to input a new X-bit test signal pattern to the circuit under test and carrying out a second test;
   (e) repeating step (d) N times ($N \geq 0$) to carry out N additional tests.

2. The method according to claim 1, wherein prior to step (a) said X+A-bit test signal pattern is generated from a set of X-bit test signal patterns by a method comprising the steps of:
   (a) sequentially selecting and offsetting selected ones of said set of X-bit test signal patterns by up to y bit positions ($1 \leq Y < X$) with respect to one another; and
   (b) overlaying said set of X-bit test signal patterns on one another as selected and offset in step (a).

3. The method according to claim 1, wherein prior to step (a) said X+A-bit test signal pattern is formed from N X-bit test signal patterns, said X-bit test signal patterns being offset with respect to one another such that all bits to be overlaid on one another are of the same logic state.

4. The method according to claim 2, wherein at least some of said X-bit test signal patterns have "don't care" bits, and wherein said X-bit test signal patterns are offset such that all bits to be overlaid on one another are either of the same logic state or are "don't care" bits.

5. The method according to claim 4, wherein said first and second X-bit test signal patterns, each having a plurality of data bits set at first or second logic states and at least one "don't care" bit at respective bit positions, are combined to form a single composite signal, by a method comprising the steps of:
   (a) offsetting said second X-bit signal test pattern with respect to said first X-bit signal test pattern by at least one bit position, so that a bit in said second X-bit signal test pattern at the first bit position is aligned with a bit in said first X-bit signal test pattern at one of a second, third . . . X-bit position, such that the respective bits of said first and second X-bit signals as aligned are either of the same logic state or of different logic states wherein one or both bits is a "don't care" bit;

(b) overlaying the first and second X-bit signal test patterns as offset on one another.

6. The method recited in claim 5, wherein the second X-bit signal test pattern is offset with respect to the first X-bit signal test pattern by not more than two bit positions.

7. The method as recited in claim 2, wherein every one of said set of X-bit signal test patterns are selected, offset, and overlaid on one another.

8. A method of testing an integrated circuit featuring scan design such as LSSD or boundary scan, including at least one scan path, comprising the steps of:

(a) forming a test signal pattern in a shift register;

(b) inputting a contiguous portion of the test signal pattern in the shift register into the scan path;

(c) measuring a response S of the integrated circuit to the test signal pattern in (b);

(d) inputting a different contiguous portion of the test pattern in the shift register into the scan path by recirculating said test signal pattern in the shift register so that the measured signal S of the cone changes its logic state from that in (b).

9. The method according to claim 8, wherein said response S of the integrated circuit to said input test patterns is measured by contactless techniques.

10. The method according to claim 9, further comprising the step of statistically analyzing said measured response S by repeatedly adding the results of measurements from each respective test pattern.

11. The method according to claim 10, wherein said statistical analysis is performed separately for each input test pattern.

* * * * *

UNITED STATES PATENT AND TRADEMARK OFFICE
CERTIFICATE OF CORRECTION

PATENT NO. : 5,485,473

DATED : January 16, 1996

INVENTOR(S) : Diebold, et al.

Figure 2A:
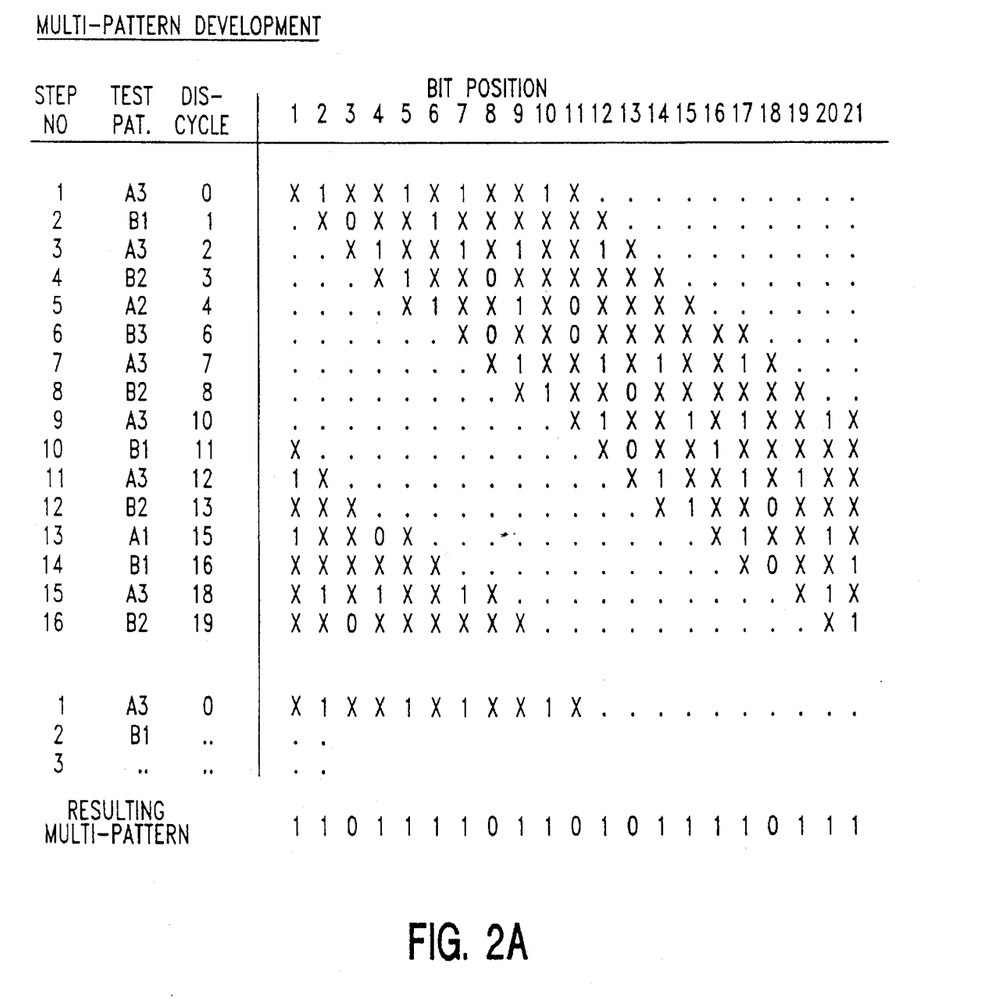
Figure 2B:
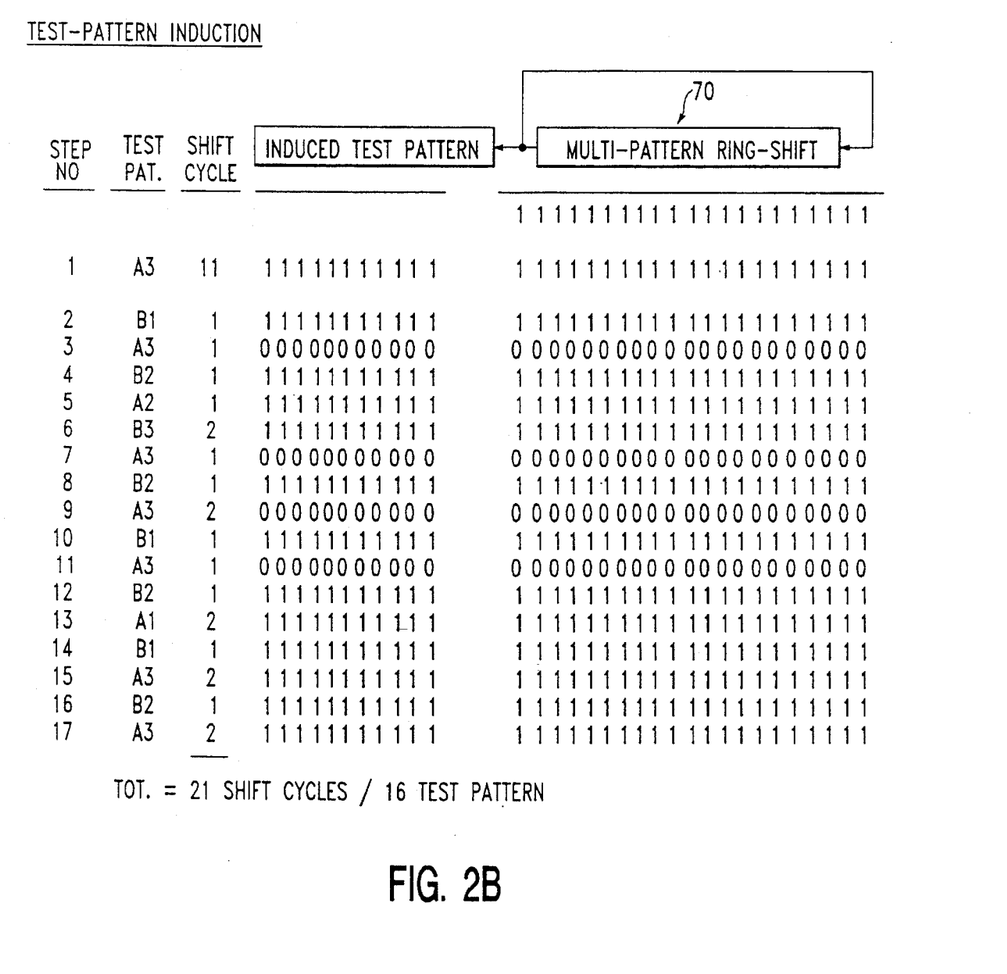

It is certified that error appears in the above-identified patent and that said Letters Patent is hereby corrected as shown below:

In the drawings:
Delete Figure 2B and replace with new Figure 2B as shown on page 2.

Signed and Sealed this

Fourth Day of January, 2000

Attest:

Attesting Officer

Acting Commissioner of Patents and Trademarks

UNITED STATES PATENT AND TRADEMARK OFFICE
CERTIFICATE OF CORRECTION

PATENT NO. : 5,485,473

DATED : January 16, 1996

INVENTOR(S) : Diebold, et al.

Page 2 of 2

It is certified that error appears in the above-identified patent and that said Letters Patent are hereby corrected as shown below:

TEST-PATTERN INDUCTION

| STEP NO | TEST PAT. | SHIFT CYCLE | INDUCED TEST PATTERN | MULTI-PATTERN RING-SHIFT |
|---|---|---|---|---|
|  |  |  |  | 1 1 0 1 1 1 1 0 1 1 0 1 0 1 1 1 1 0 1 1 1 |
| 1 | A3 | 11 | 1 1 0 1 1 1 1 0 1 1 0 | 1 0 1 1 1 1 0 1 1 1 1 0 1 1 1 1 0 1 1 0 |
| 2 | B1 | 1 | 1 0 1 1 1 1 0 1 1 0 1 | 0 1 1 1 1 0 1 1 1 1 0 1 1 1 1 0 1 1 0 1 |
| 3 | A3 | 1 | 0 1 1 1 1 0 1 1 0 1 0 | 1 1 1 1 0 1 1 1 1 0 1 1 1 1 0 1 1 0 1 0 |
| 4 | B2 | 1 | 1 1 1 1 0 1 1 0 1 0 1 | 1 1 1 0 1 1 1 1 0 1 1 1 1 0 1 1 0 1 0 1 |
| 5 | A2 | 1 | 1 1 1 0 1 1 0 1 0 1 1 | 1 1 0 1 1 1 1 0 1 1 1 1 0 1 1 0 1 0 1 1 |
| 6 | B3 | 2 | 1 0 1 1 0 1 0 1 1 1 1 | 0 1 1 1 1 0 1 1 1 1 0 1 1 0 1 0 1 1 1 1 |
| 7 | A3 | 1 | 0 1 1 0 1 0 1 1 1 1 0 | 1 1 1 1 0 1 1 1 0 1 1 0 1 0 1 1 1 1 0 |
| 8 | B2 | 1 | 1 1 0 1 0 1 1 1 1 0 1 | 1 1 1 0 1 1 1 1 0 1 1 0 1 0 1 1 1 1 0 1 |
| 9 | A3 | 2 | 0 1 0 1 1 1 1 0 1 1 1 | 1 1 0 1 1 1 0 1 1 0 1 0 1 1 1 1 0 1 1 1 |
| 10 | B1 | 1 | 1 0 1 1 1 1 0 1 1 1 1 | 1 0 1 1 1 1 0 1 1 0 1 0 1 1 1 1 0 1 1 1 1 |
| 11 | A3 | 1 | 0 1 1 1 1 0 1 1 1 1 1 | 0 1 1 1 1 0 1 1 0 1 0 1 1 1 1 0 1 1 1 1 1 |
| 12 | B2 | 1 | 1 1 1 1 0 1 1 1 1 1 0 | 1 1 1 1 0 1 1 0 1 0 1 1 1 1 0 1 0 1 1 1 0 |
| 13 | A1 | 2 | 1 1 0 1 1 1 1 0 1 1 | 1 1 0 1 1 0 1 0 1 1 1 1 0 1 0 1 1 1 0 1 1 |
| 14 | B1 | 1 | 1 0 1 1 1 1 0 1 1 1 | 1 0 1 1 0 1 0 1 1 1 1 0 1 0 1 1 1 0 1 1 1 |
| 15 | A3 | 2 | 1 1 1 1 0 1 1 1 1 0 | 1 1 0 1 0 1 1 1 0 1 0 1 1 1 0 1 1 1 1 0 |
| 16 | B2 | 1 | 1 1 1 0 1 1 1 1 0 1 | 1 0 1 0 1 1 1 0 1 0 1 1 1 0 1 1 1 1 0 1 |
| 17 | A3 | 2 | 1 1 0 1 1 1 0 1 1 0 | 1 0 1 1 1 0 1 1 1 1 0 1 1 1 0 1 1 0 |

TOT. = 21 SHIFT CYCLES / 16 TEST PATTERN

FIG. 2B